United States Patent
Lee et al.

(10) Patent No.: US 7,536,666 B1
(45) Date of Patent: May 19, 2009

(54) INTEGRATED CIRCUIT AND METHOD OF ROUTING A CLOCK SIGNAL IN AN INTEGRATED CIRCUIT

(75) Inventors: Thomas Anthony Lee, Lakeville, MN (US); James P. Ross, Lakeville, MN (US)

(73) Assignee: Xilinx, Inc., San Jose, CA (US)

( * ) Notice: Subject to any disclaimer, the term of this patent is extended or adjusted under 35 U.S.C. 154(b) by 876 days.

(21) Appl. No.: 10/993,863

(22) Filed: Nov. 19, 2004

(51) Int. Cl.
*G06F 17/50* (2006.01)
*H01L 25/00* (2006.01)
*H03K 19/0175* (2006.01)
*H03K 19/177* (2006.01)

(52) U.S. Cl. .................. 716/13; 716/14; 716/9; 716/10; 716/16; 326/39; 326/41; 326/47; 326/101

(58) Field of Classification Search .................. 716/13, 716/14, 9, 10, 16; 326/39, 41, 47, 101
See application file for complete search history.

(56) References Cited

U.S. PATENT DOCUMENTS

| | | | | | |
|---|---|---|---|---|---|
| 4,475,191 | A * | 10/1984 | James et al. | ................ | 370/458 |
| 5,122,691 | A * | 6/1992 | Balakrishnan | ................ | 326/86 |
| 5,157,326 | A * | 10/1992 | Burnsides | ................ | 324/537 |
| 5,239,562 | A * | 8/1993 | Grimes | ................ | 375/358 |
| 5,818,884 | A * | 10/1998 | Reymond | ................ | 375/354 |
| 6,185,644 | B1 * | 2/2001 | Farmwald et al. | ............ | 710/301 |
| 6,351,489 | B1 * | 2/2002 | Tetzlaff | ................ | 375/238 |
| 6,686,774 | B1 * | 2/2004 | Soni | ................ | 326/86 |
| 6,911,842 | B1 * | 6/2005 | Ghia et al. | ................ | 326/41 |
| 7,069,458 | B1 * | 6/2006 | Sardi et al. | ................ | 713/401 |
| 7,133,648 | B1 * | 11/2006 | Robinson et al. | ................ | 455/88 |
| 2002/0021686 | A1 * | 2/2002 | Ozluturk et al. | ............ | 370/342 |
| 2003/0126356 | A1 * | 7/2003 | Gustavson et al. | .......... | 711/105 |
| 2005/0242866 | A1 * | 11/2005 | Vadi et al. | ................ | 327/291 |
| 2005/0242867 | A1 * | 11/2005 | Ghia et al. | ................ | 327/291 |
| 2005/0256969 | A1 * | 11/2005 | Yancey et al. | ................ | 709/238 |
| 2006/0071691 | A1 * | 4/2006 | Garlepp | ................ | 326/93 |

OTHER PUBLICATIONS

U.S. Appl. No. 10/618,404, filed Jul. 11, 2003, Young.
U.S. Appl. No. 10/661,016, filed Sep. 11, 2003, Groen et al.
U.S. Appl. No. 10/683,944, filed Oct. 10, 2003, Young.
U.S. Appl. No. 10/836,722, filed Apr. 30, 2004, Vadi et al.
U.S. Appl. No. 10/993,583, filed Nov. 19, 2004, Lee.
U.S. Appl. No. 10/993,607, filed Nov. 19, 2004, Lee.
U.S. Appl. No. 10/993,886, filed Nov. 19, 2004, Lee.

* cited by examiner

*Primary Examiner*—Phallaka Kik
(74) *Attorney, Agent, or Firm*—John J. King

(57) ABSTRACT

The various embodiments of the present invention relate to coupling clock signals between a plurality of data transceivers. According to one embodiment, a clock routing circuit having data transceivers comprises a clock bus interface and a first data transceiver coupled to the clock bus interface to receive a clock signal from the clock bus interface. A clock bus coupled to receive the clock signal enables the transfer of the clock signal to an adjacent data transceiver. According to other embodiments, various clock buses and interfaces enable routing clock signals between various circuits of the integrated circuit.

39 Claims, 9 Drawing Sheets

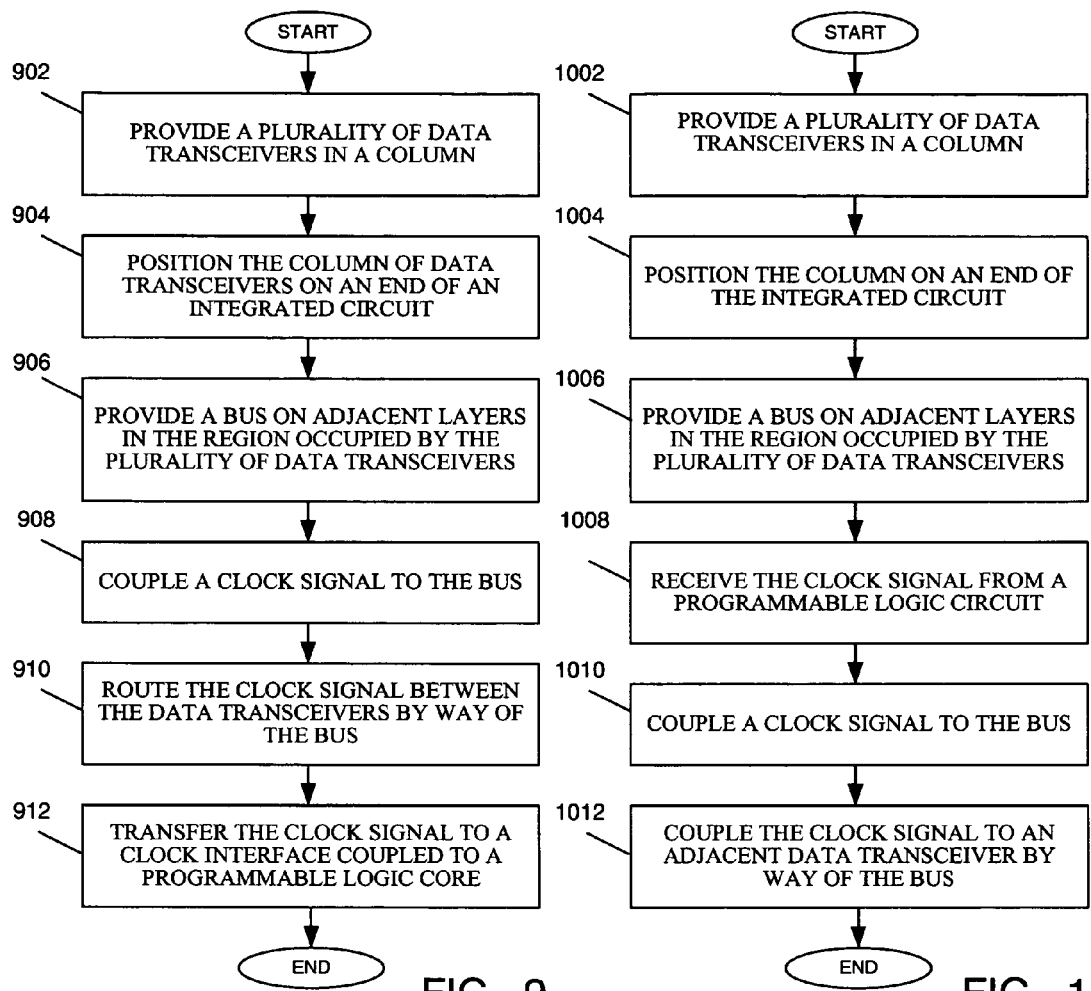

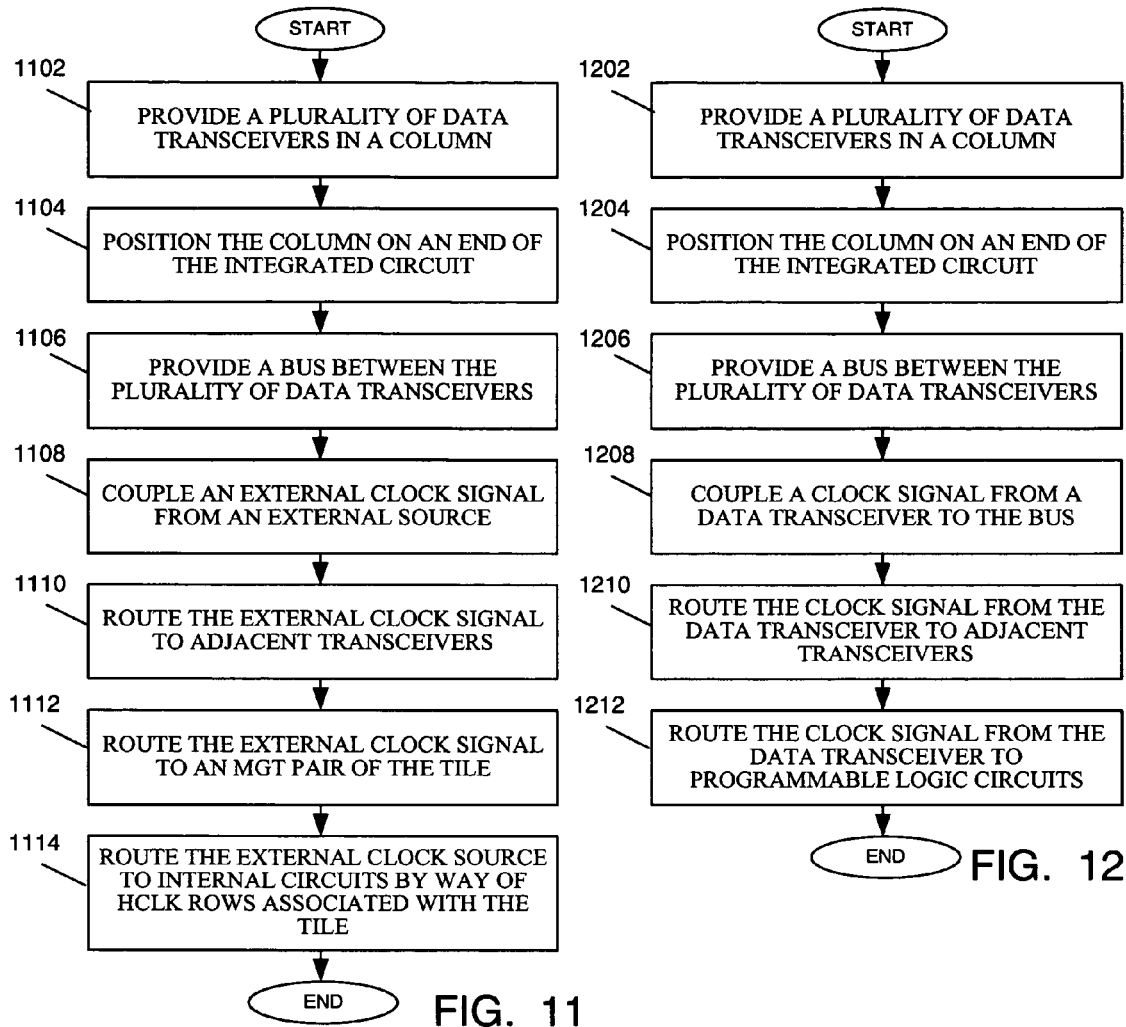

INTEGRATED CIRCUIT AND METHOD OF ROUTING A CLOCK SIGNAL IN AN INTEGRATED CIRCUIT

FIELD OF THE INVENTION

The present invention relates generally to integrated circuits, and in particular, to an integrated circuit having data transceivers, and a method of routing clock signals in an integrated circuit.

BACKGROUND OF THE INVENTION

Within electronic circuits or systems, communication takes place at various levels and distances, including on an integrated circuit (IC), within a printed circuit board (PCB) or card, between PCBs within a chassis, and between equipment or chassis. The transfer of data, such as between integrated circuits or between cards on a backplane, is often required in a digital system design. Transferring data by way of a serial communications channel has become increasingly important. Serial communications channels make greater use of the available resources, such as the number of pins used to transfer data. System interface standards address increasing bandwidth requirements between IC components, line cards, and systems. However, as data rates exceed 1 Gbps, new challenges arise for system designers. Numerous technology advancements and capabilities are associated with current advanced serial interfaces. To successfully design and deploy products using multi-gigabit serial links, the signaling channel must be carefully designed with the aid of high-accuracy channel simulation models.

One of the most important advantages of serial interface technologies is cost reduction. While cost premiums may be acceptable for a short time, long-term cost advantages are necessary to ensure that a given technology will be adopted and supported. Even at high performance levels, serial interfaces help reduce connector costs, package costs, and possibly board costs. High speed I/O and connectivity allow digital systems to achieve breakthrough performance processing. Accordingly, serial interfaces will result in better performance scalability, interconnect density, pin count reduction, cost containment, and greater capacity.

As data transfer speeds have increased, high-speed differential serial lines have replaced large parallel buses in many designs. A Serializer/Deserializer (SERDES) converts parallel data into differential serial data, and differential serial data into parallel data. While parallel interfaces will remain essential to the core of traditional monolithic uniprocessor or multiprocessor platforms, many other I/O grade interfaces will become serial. Recently, serial interconnect technologies have matured to enable high-speed switched architectures with excellent performance and scalability, as well as low pin counts and cost. Clock speeds have increased from 33-133 MHz using parallel connectivity, to 2-10 GHz using serial connectivity.

However, signal integrity is critical for data throughput in high speed serial channels. Also, the ability to route highly accurate clock signals is important for enabling the use of high speed data transceivers. Accordingly, there is a need for an improved integrated circuit having data transceivers and method of routing clock circuits in an integrated circuit.

SUMMARY OF THE INVENTION

The various embodiments of the present invention relate to coupling clock signals between a plurality of data transceivers. Specific implementations of routing clock signals originating from (i) an external source, (ii) internals circuits of an integrated circuit, or (iii) a data transceiver of the integrated circuit are disclosed. According to the various embodiments of the present invention, these clock signals, in addition to being routed to a plurality of adjacent data transceiver, could be routed between a data transceiver and internal circuits of an integrated circuit. According to one embodiment, a clock routing circuit in an integrated circuit having a plurality of data transceivers comprises a clock bus interface and a data transceiver coupled to the clock bus interface to receive a clock signal from the clock bus interface. A clock bus coupled to receive the clock signal enables the transfer of the clock signal to an adjacent data transceiver.

According to an alternate embodiment of the present invention, a clock routing circuit in an integrated circuit having a plurality of data transceivers comprises a clock driver coupled to receive an external clock at a circuit associated with a data transceiver. A first clock bus is coupled to the clock driver and is controlled by the clock driver to couple the external clock to an adjacent data transceiver. A data transceiver clock interface or an internal circuit clock interface could be coupled to the first clock bus to receive the external clock signal. A second clock bus could also be employed to route clock signals from the data transceivers to adjacent data transceivers or the internal clock interface.

According to a further alternate embodiment of the present invention, a clock routing circuit in an integrated circuit having a plurality of data transceivers comprises a data transceiver clock interface, and a clock bus extending between the plurality of data transceivers and coupled to a clock driver. The clock bus receives a clock signal generated by the data transceiver. An internal circuit clock interface receives the clock signal generated by the data transceiver and couples the clock signal to an internal circuit of the integrated circuit. A second clock bus could also be employed to route a clock signal from internal circuits or between the plurality of data transceivers.

A number of methods of routing clock signals in an integrated circuit are also disclosed. According to one embodiment of the present invention, a method of routing a clock signal in an integrated circuit comprises steps of providing a plurality of data transceivers in a column; providing a bus coupling the plurality of data transceivers; and routing a clock signal to the plurality data transceivers by way of the bus. Steps of routing the clock signals between specific circuits of the integrated circuits are also disclosed. Methods of forming integrated circuits having clock buses coupling clock signals between a plurality of data transceivers are also disclosed.

BRIEF DESCRIPTION OF THE DRAWINGS

FIG. 9 is a flow chart showing a method of routing a clock signal between a plurality of data transceivers in an integrated circuit according to an embodiment of the present invention;

FIG. 10 is a flow chart showing a method of routing a clock signal from a programmable logic circuit between a plurality of data transceivers in an integrated circuit according to an embodiment of the present invention;

FIG. 11 is a flow chart showing a method of routing an external clock signal to a plurality of data transceivers and a programmable logic circuit in an integrated circuit according to an embodiment of the present invention;

FIG. 12 is a flow chart showing a method of routing a clock signal generated by a data transceiver to a plurality of other data transceivers and a programmable logic circuit of an integrated circuit according to an embodiment of the present invention.

DETAILED DESCRIPTION OF THE DRAWINGS

Figure 1:
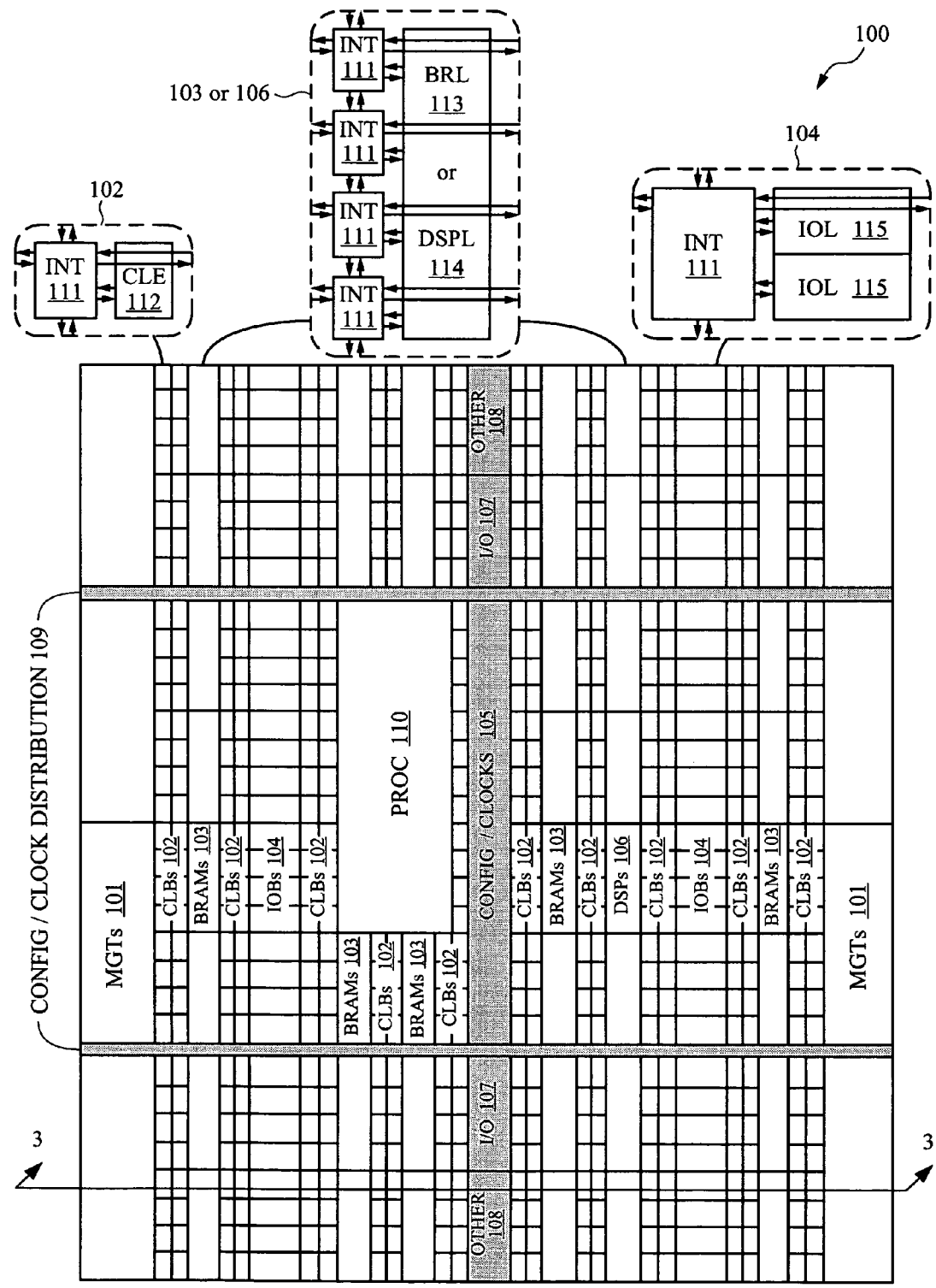
FIG. 1 is a plan view of an integrated circuit showing the arrangement of circuit elements according to an embodiment of the present invention.

Turning first to FIG. 1, a block diagram of a circuit for implementing circuit and methods for enabling transferring data according to an embodiment of the present invention is shown. In particular, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic. Similarly the circuits and methods of the present invention could be implemented in any device, including any type of programmable logic device, having memory.

Figure 2:
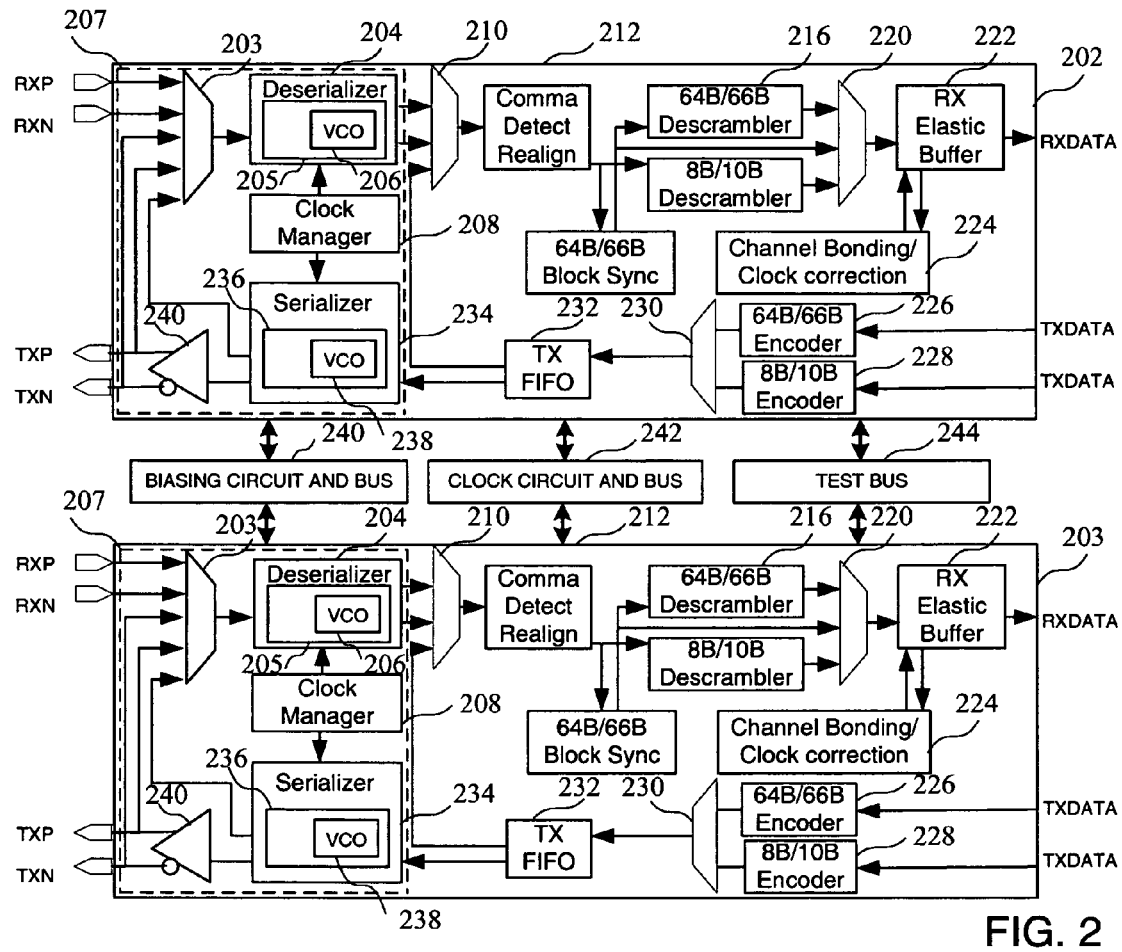
FIG. 2 is a block diagram of a data transceiver pair and associated buses according to an embodiment of the present invention.

Turning now to FIG. 2, a block diagram of a data transceiver pair and associated buses according to an embodiment of the present invention is shown. Because the MGT pair comprises same or similar data transceivers 202 and 203 (also called multi-gigabyte transceivers or MGTs) on opposite sides of a bus, only a single data transceiver 202 is described. In particular, the data transceiver 202 comprises a multiplexer 203 coupling received or transmitted signals to a deserializer 204 (having a phase-locked loop (PLL) and a voltage controlled oscillator (VCO) 206) of an analog portion 207, the output of which is coupled to a multiplexer 210. The multiplexer 210 generates an output to a comma detect realignment circuit 212. An 8B/10B descrambler 214 receives the output of the comma detect realignment circuit 212. Similarly, a 64B/66B descrambler 216 receives the output of the comma detect realignment circuit 212 by way of a 64B/66B block sync circuit 218. The outputs of the 8B/10B descrambler 214 and a 64B/66B descrambler 216 are coupled to a multiplexer 220, the output of which coupled to a receiver elastic buffer 222. The receiver elastic buffer 222, which receives input from the channel bonding/clock correction block 224, generates the received data RXDATA. The data transceiver 202 also receives transmission data TXDATA which is coupled to a 64B/66B encoder 226 and a 8B/10B encoder 228, the outputs of which are coupled by a multiplexer 230 to a transmission FIFO 232. The output of the transmission FIFO 232 is coupled to a serializer 234. Serializer 234 comprises a phase-locked loop 236 having a voltage controlled oscillator 238 and generating the transmission data TXP and TXN.

Because there are many sensitive nodes within a 10 Gbps serializer/deserializer (SERDES), the analog circuits 207 are formed on the end of the data transceivers 202 and 203. For example, the input to the VCO of the SERDES PLL is sensitive to very low noise levels, where these low levels can pass easily through the substrate. By putting the SERDES on the outside column, the layout of an embodiment of the present invention creates physical isolation by virtue of the physical separation from the other circuits. Further, because there is not a noise source on both sides of the SERDES and thus does not create voltage potentials across the substrate running under the sensitive analog circuits of the SERDES, the layout reduces noise.

The following example illustrates that 62 microvolts of substrate noise presented to the input of the VCO at a modulation frequency of 1 MHz will generate 1 ps of jitter at the output. The transfer function of a VCO is given by:
EQ. 1:

$$H_{vco}(s) = \frac{K_0}{s},$$

where $K_0$ is in radians/second/volt.

At 5 Ghz (10 Gbps), one unit interval (UI) is 100 picoseconds (ps). A modulation of 1 ps is $1/100 \cdot \pi = 0.031$ radians. The above equation uses pi instead of 2·pi because 100 ps is one half cycle. When the modulation frequency is 1 MHz, the period (p) is equal to $2 \cdot \pi \cdot 10^6$ radians/second. Accordingly, Hvco(p) =500 radians/volt, and the voltage=0.031/500=$6.2 \times 10^{-6}$ volts. The VCO output is given by:

$$V_{VCO}(t) = V0 \cdot \sin(2 \cdot \pi \cdot 5 \cdot 10^9 \cdot t + 0.031 \cdot \sin(2 \cdot \pi \cdot 10^6 \cdot t)). \quad \text{EQ. 2}$$

The instantaneous frequency is given by:

$$2 \cdot \pi \cdot 5 \cdot 10^9 t + 0.031 \cdot 2 \cdot \pi \cdot 10^6 \cdot \sin(2 \cdot \pi \cdot 10^6 \cdot t). \quad \text{EQ. 3}$$

The frequency of the wobble is 1 MHz, while the amplitude is $0.031 \cdot 2 \cdot \pi \cdot 10^6 = 1.948 \times 10^5$ radians/second. Therefore, the VCO frequency is shifted by 31 kHz at a 1 MHz rate.

Figure 3:
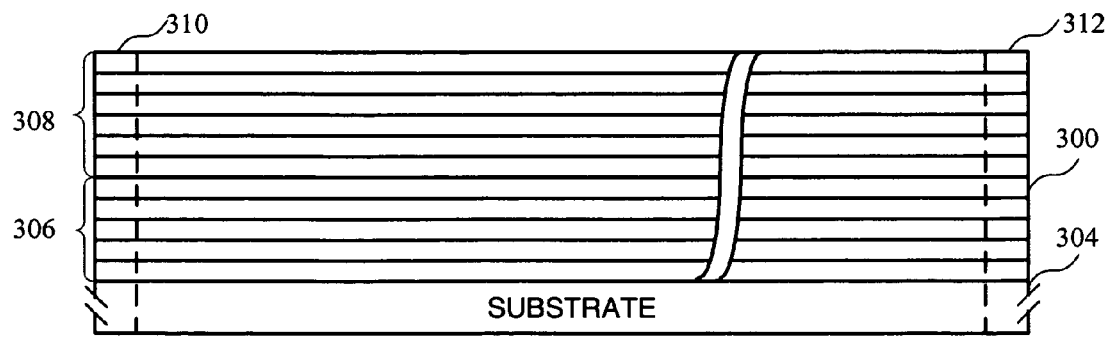
FIG. 3 is a cross section of an integrated circuit showing metal layers according to an embodiment of the present invention.

Turning now to FIG. 3, a cross section of an integrated circuit showing metal layers according to an embodiment of the present invention is shown. In particular, data transceivers of an integrated circuit 300 comprise circuit elements formed in a substrate 304, such as the circuit elements described in FIGS. 1 and 2, and a plurality of metal layers 306 and 308 coupling the circuit elements formed in the substrate. For example, the first 5 layers 306 could comprise conductors used for connecting circuit elements of the various functional blocks, such as BRAM or CLBs of a programmable logic device, while the interconnect circuits (i.e. conductors for connecting the various functional blocks) could be positioned on the upper six layers 308. Even layers of the interconnect layers could be used to route signals in a longitudinal direction, while odd layers could be used to route signals in a lateral direction. The substrate comprises circuit elements related to the data transceiver formed in the columns 310 and 312, while other circuits of a programmable logic device are formed in the substrate between columns 310 and 312.

Figure 4:
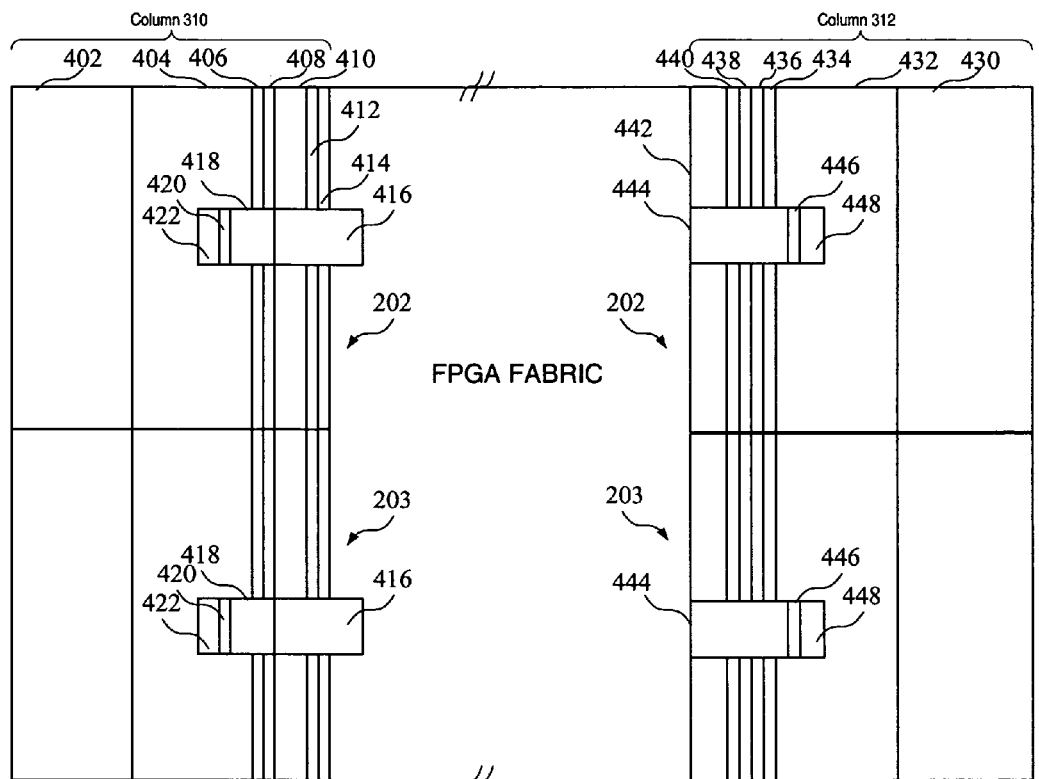
FIG. 4 is a plan view showing the arrangement of circuit elements of data transceivers according to an embodiment of the present invention.

According to one aspect of the invention, data transceivers are positioned on two ends of the integrated circuit, as shown for example by columns 310 and 312 (which will be shown in more detail in reference to FIG. 4). Because the data transceivers do not require interconnect circuits, all eleven layers in the region occupied by the data transceivers as shown could be used for the data transceivers. That is, unlike the portion of the layers having conductors for the functional blocks which are restricted to a first number of metal layers which is less than the total number of metal layers (i.e. leaving some metal layers for the interconnects between the functional blocks), the connections and buses for the data transceivers could be spread out over a greater number of layers than the first number of layers used for the functional blocks of the other parts of the circuit (e.g. all of the layers 306 and 308). Such a positioning of the data transceivers on the ends of the integrated circuit (i.e. preferably both the circuit elements formed in the substrate and some or all of the metal layers connecting the circuit elements) provides improved noise immunity, resource sharing, routing resource availability and ease of implementation, as will be described in more detail below. An example of a data transceiver could be, for example, a RocketPHY 10 Gbps serial data transceiver available from Xilinx, Inc., San Jose, Calif.

Turning now to FIG. 4, a plan view shows an arrangement of circuit elements of data transceivers according to an embodiment of the present invention. In particular, column 310, which shows the layout of an MGT pair, comprises a physical media attachment (PMA) sub-column 402 which comprises analog circuits for transmitting and receiving data. Because the analog circuits are generally more sensitive to noise, the sub-column having analog circuit is preferably positioned on the end of column 310. A sub-column 404 comprising digital circuits is preferably positioned adjacent to the sub-column having the analog circuits. A plurality of interconnect sub-columns are also positioned inside of the sub-columns of digital circuits. In particular, the interconnect sub-columns comprise a dynamic MCs column 406, an initial term column 408, an interconnect column 410, an interface column 412, and a route inverter column 414. Finally, an HCLK region 416, an empty space 418, an HCLK termination region 420 and a dynamic controller 422 enable the transfer of clock signals across the columns of the first MGT. Similar HCLK regions enabling the transfer of clock signals across the columns of the second MGT are also shown. The arrangement of circuits in FIG. 4 applies to both circuit elements formed in the substrate as well as conductors on the metal layers associated with the various circuits of the data transceivers. Although there will be conductors of metal layers extending between the various columns providing signals between circuits of the columns, there will generally be fewer metal layers over the analog circuit elements of the substrate because the analog circuits elements are on the end.

According to another aspect of the invention, columns having analog and digital circuits are preferably "mirrored" on the other side of the integrated circuit. That is, a second set of columns is provided on the other side of the FPGA fabric which generally provides the circuits for implementing an FPGA as described in reference to FIG. 2. Column 312 comprises another column of analog circuits 430 positioned on the end of the integrated circuit, and a column of digital circuits 432 positioned inside of the analog circuits. A plurality of interconnect sub-columns are also positioned inside of the sub-columns of digital circuits of column 312. It should be noted that while the digital and analog circuit columns are preferably mirrored (i.e. the analog circuit on the outside and the digital circuit on the inside), the interface columns are preferably not mirrored. The interface columns are formed in any order as needed. In particular, the interconnect sub-columns of column 312 as shown comprise a route inverter column 434, a dynamic MCs column 436, an initial term column 438, an interface column 440, and an interconnect column 442. Finally, an HCLK region 444, an HCLK termination region 446 and a dynamic controller 448 enable the transfer of clock signals across the columns. While FIG. 4 shows two data transceivers pairs in the two columns 310 and 312, additional MGT pairs could be employed above and below the data transceivers according to the present invention. The two data transceiver pairs are merely shown by way of example.

Figure 5:
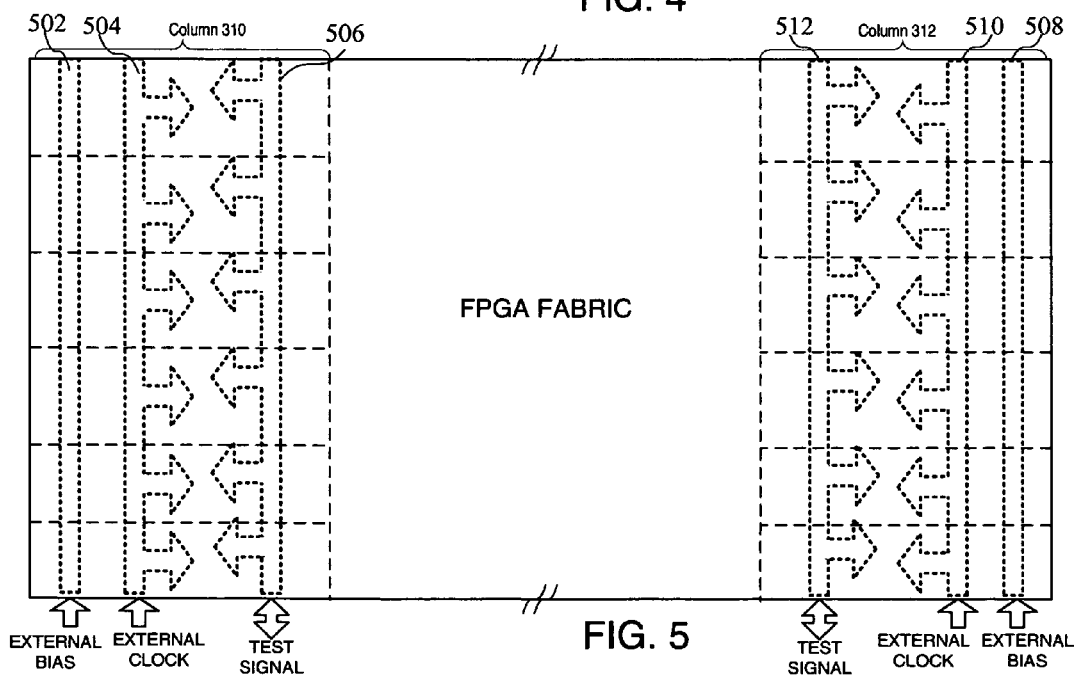
FIG. 5 is a plan view showing the arrangement of buses in a region occupied by data transceivers according to an embodiment of the present invention.

Turning now to FIG. 5, a plan view shows the arrangement of buses in a region occupied by data transceivers according to an embodiment of the present invention. According to another aspect of the invention, because interconnect circuits are not required in the columns having data transceivers as they are in portions of the FPGA fabric having functional blocks, it is possible to easily include various buses extending between the data transceivers. For example, an external bias could be applied to the integrated circuit and routed between pairs of data transceivers by way of an external bias bus 502. Similarly, an external clock could be coupled to a vertical clock bus 504 to couple clock signals from an external clock, or a clock provided by an HCLK row, for example. The vertical clock bus could also be coupled to the FPGA fabric. Finally, test signals could be coupled to a test bus 506, and routed between the data transceivers pairs. A similar external bias bus 508, external clock bus 510 and test signal bus 512 could be employed in the column 312. The buses could be positioned in any layers of the columns 310 and 312. Similarly, the circuits for the data transceivers could be positioned within the buses in as many layers of 306 and 308 as necessary.

Figure 6:
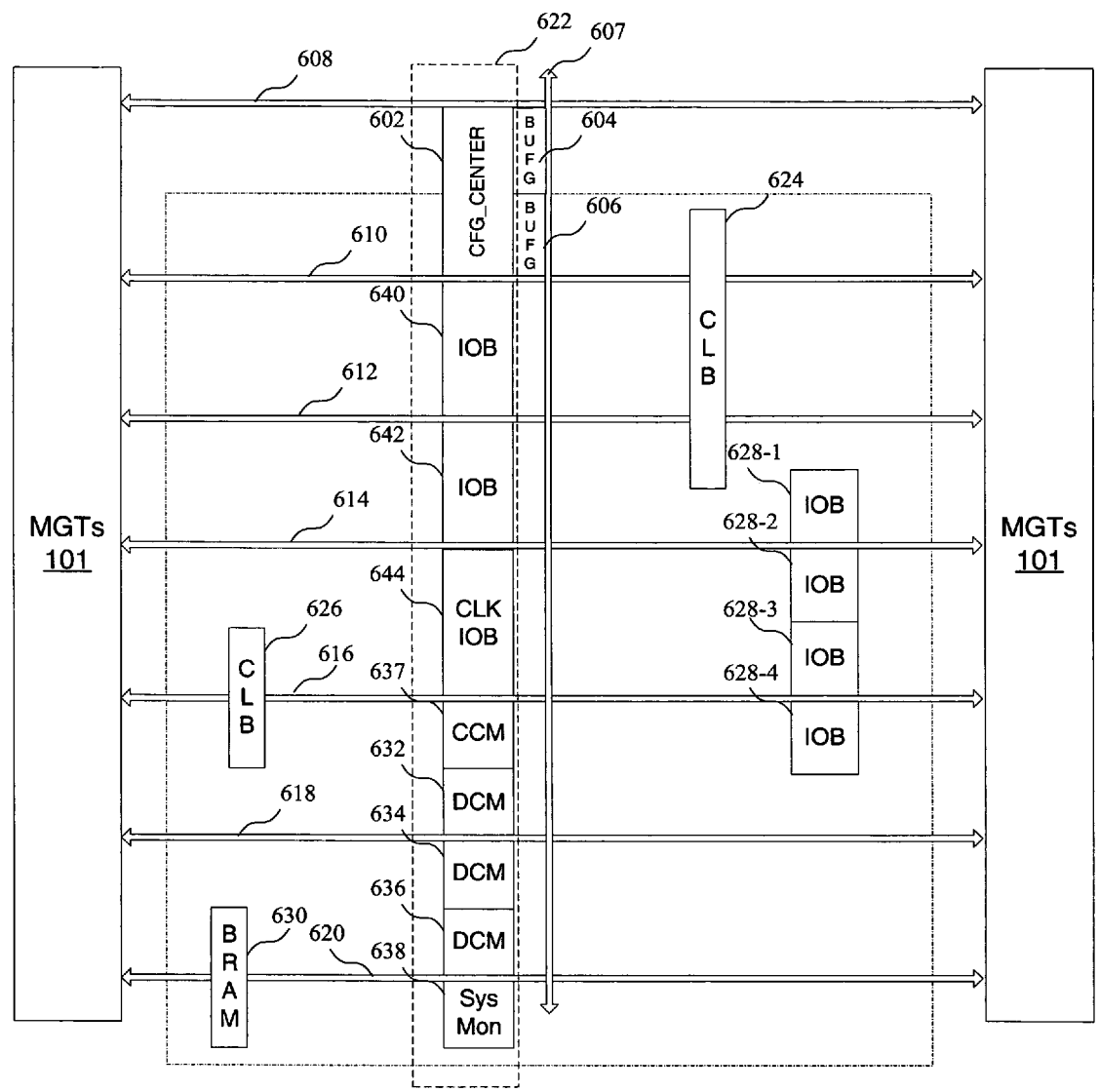
FIG. 6 is a block diagram of a clock tree and the center column on the bottom half of the die according to an embodiment of the present invention.

Turning now to FIG. 6, a block diagram of a clock tree and the center column on the bottom half of the die according to an embodiment of the present invention. For ease of illustration, FIG. 6 only shows the bottom half of the FPGA. The top half is similar to the bottom half (minus the CFG_CENTER 602 and BUFGs 604 and 606). The clock tree has a main trunk or backbone 607 and main horizontal branches, i.e., HCLK rows 608, 610, 612, 614, 616, 618, and 620. Both the main trunk 602 and main horizontal branches 608-620 provide global differential clocks signals to circuits in, for example, the center column 622 and MGT blocks 101. The MGTs comprises data transceivers described above in reference to FIGS. 2-5. For CLBs 624 and 626, IOBs 628-1 to 628-4, and BRAMs 630, the differential clock signal is converted into a single ended clock signal. Some circuit blocks such as the DCMs 632-636, CCM 637, and System Monitor (SysMon) 638 may receive both differential and single ended clock signals.

The center column 622 has heterogeneous circuit elements or blocks such as the configuration logic (CFG_CENTER 602), IOBs 640 and 642, specialized clock IOBs (CLK IOB 644) for receiving one or more external single ended or differential clock signals, CCM 637, DCMs 632-636, and System Monitor 638. Adjacent to CFG_CENTER 602 there are two circuits BUFG_MUXs (labeled as BUFG) 604 and 606 having multiplexer circuitry, that provide differential clock signals from the specialized clock IOBs, e.g., CLK IOB 644 and/or the DCMs, e.g., DCMs 632-636, and optionally, the MGTs 101 to the clock tree backbone 607. BUFG_MUX 604 receives the differential clock signals from the specialized clock IOBs, DCMs, and optionally, the MGTs 101 on the top half of the FPGA (not shown). BUFG_MUX 606 receives the differential clock signals from the specialized clock IOBs, e.g., CLK IOB 644, the DCMs, e.g., DCMs 632-636, and optionally, the MGTs 101 on the bottom half of the FPGA. Specific circuits for routing clock signals within the fabric of an FPGA are described in more detail in U.S. patent application Ser. No. 10/836,722, filed on Apr. 30, 2004 titled "A DIFFERENTIAL CLOCK TREE IN AN INTEGRATED CIRCUIT" by Vadi et al., which is herein incorporated by reference.

Figure 7:
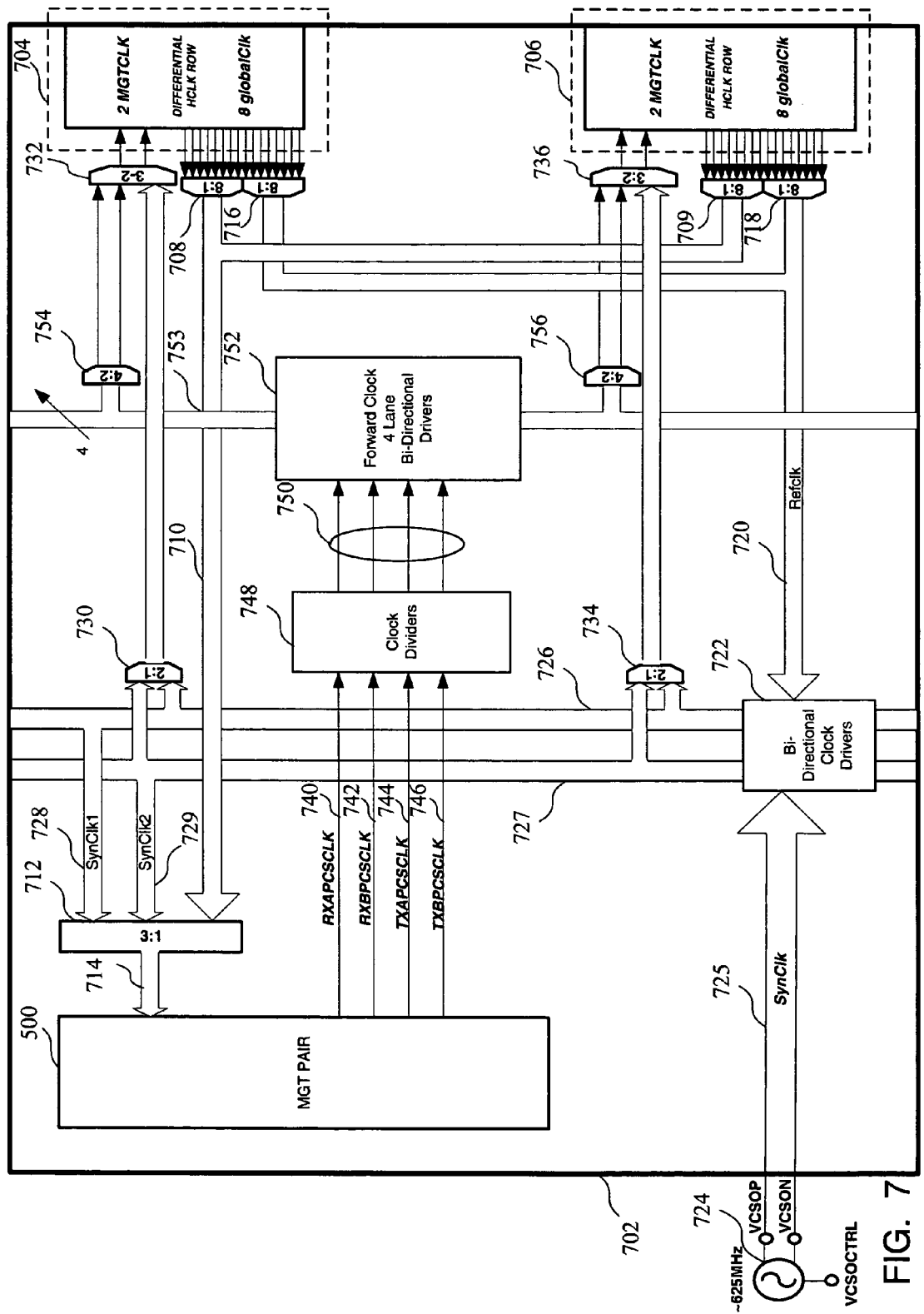
FIG. 7 is a block diagram of a circuit for routing clock signals in an integrated circuit according to an according to an embodiment of the present invention.

Turning now to FIG. 7, a block diagram of a circuit for routing clock signals in an integrated circuit according to an embodiment of the present invention is shown. The circuit of FIG. 7 is a simplified diagram of the clock circuits associated with an MGT tile comprising an MGT pair 500, (e.g., 202 and 203 of FIG. 2) and coupled to two HCLK rows. In particular, a clock routing circuit 702 comprises an internal circuit clock interface having a first clock bus interface 704 and a second clock bus interface 706. The first clock bus interface 704 and second clock bus interface 706 enable coupling differential clock signals to or from HCLK rows of an integrated circuit, such as the HCLK rows 610-620 of FIG. 6, for example. In describing the coupling of clock signals from an HCLK row, the clock bus interfaces enable coupling global clocks from the internal circuits of an FPGA (e.g. the circuits between the MGT columns 101 of FIG. 1) to a clock selection multiplexer 708, which selects one of eight global clock signals, for example. The selected global clock signal is coupled to a global clock bus 710. Alternatively, a global clock selected by a multiplexer 709 associated with the second clock bus interface 706 could be coupled to global clock bus 710. The global clock bus 710 is coupled to a data transceiver clock bus interface, which could comprise a clock select multiplexer 712 for coupling a selected clock to the MGT pair 500 by way of a clock bus 714.

In addition to selecting a global clock from an HCLK row by way of the global clock bus 710, a reference clock (Refclk) 720 could be received from a clock selection multiplexer 716 associated with the first clock bus interface 704 or a clock selection multiplexer 718 associated with the second clock bus interface 706. The clock signals from the HCLK rows are preferably differential clock signals. A clock signal selected by multiplexer 716 or multiplexer 718 is coupled by a reference clock bus 720 to a bi-directional clock driver 722. The bi-directional clock driver 722 comprises a repeater for routing a clock signal received from an adjacent MGT tile, a reference clock from HCLK row of the FPGA fabric, or a clock signal from an external clock 724 by way of an external clock bus 725 to other parts of the integrated circuit by way of a first clock bus 726 or a second clock bus 727. The routing of clock signals by the bi-directional clock driver 722 will be described in more detail below.

According to another aspect of the invention, the clock select multiplexer 712 can select one of a number of clocks routed to the clock routing circuit 702 by way of clock bus 728 or clock bus 729. For example, a low speed clock can be routed from the fabric of the FPGA for certain functions of the MGT pair 500, while an external high speed clock could also be coupled to the MGT pair for high speed applications. Further, a clock signal from another data transceiver, such as a data transceiver of an adjacent MGT tile, can be routed to an MGT pair 500 by way of the bi-directional clock driver 722, depending upon the signals selected.

According to another aspect of the invention, a clock signal routed on clock bus 726 or clock bus 727 can be coupled to an HCLK row of the circuit. For example, a clock signal on one of the clock buses 726 or 727 by way of a multiplexer 730 and another clock selection multiplexer 732. Multiplexer 730 selects one of two differential clock signals and outputs a differential clock signal to multiplexer 732. Similarly, a clock signal on one of the clock buses 726 or 727 can be selected by way of another clock selection multiplexer 734 and a multiplexer 736. Multiplexer 734 also selects one of two differential clock signals and outputs a differential clock signal to multiplexer 736. The function of multiplexers 732 and 736, which also enable the selection of a clock signal from the MGT pair 500, will be described in more detail below.

In addition to routing clock signals to data transceivers, clock signals could also be routed from a data transceiver to an HCLK row of the circuit. In particular, single ended transmit and receive clock signals comprising RXAPCSCLK signal 740, RXBPCSCLK signal 742, TXAPCSCLK signal 744, TXBPCSCLK signal 746 signals are coupled to another data transceiver clock interface comprising a clock divider 748, which generally divides the clock signal to desirable clock signals 750, and a forward clock bi-directional clock driver 752. The forward clock bi-directional clock driver 752 preferably comprises a four lane bi-directional clock driver for coupling divided clock signals from the MGT pair 500 to the HCLK rows by way of a clock bus 753. That is, bus 753 is coupled to a 4:2 multiplexer 754 for coupling two clock signals to the 3:2 multiplexer 732. Similarly, bus 753 is coupled to a 4:2 multiplexer 756 for coupling two clock signals to the 3:2 multiplexer 736. The selected clock signals are coupled as differential signals by the multiplexers 732 and 736 to clock bus interfaces 704 and 706. The MGT forward clock bi-directional clock driver 752 also couples clock signals from an MGT pair between data transceivers of adjacent tiles. The clock routing circuit 702 is preferably incorporated in the regions having MGTs 101.

Figure 8:
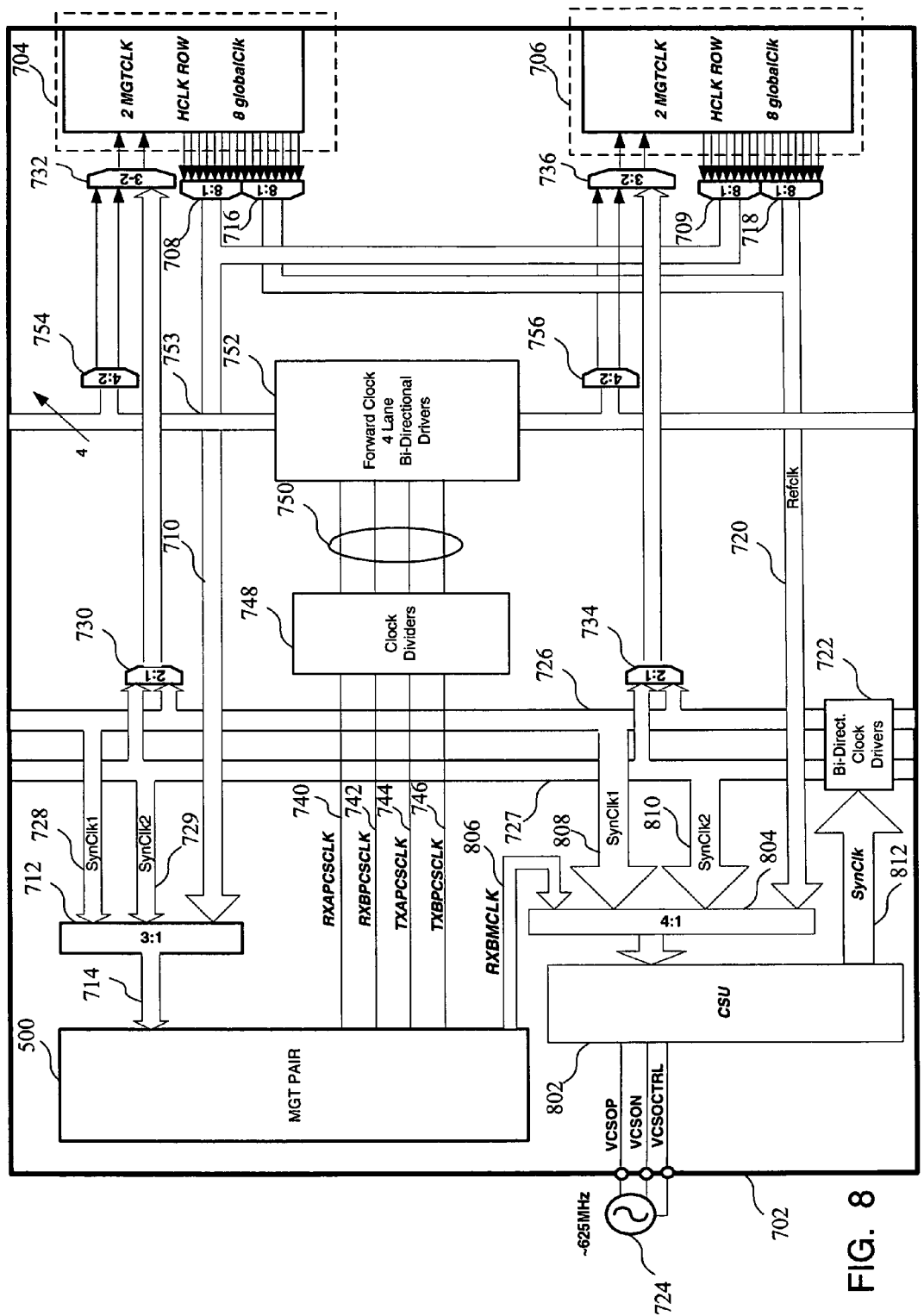
FIG. 8 is a block diagram of a circuit for routing clock signals in an integrated circuit according to an alternate embodiment of the present invention.

Turning now to FIG. 8, a block diagram of a circuit for routing clock signals in an integrated circuit according to an alternate embodiment of the present invention is shown. In particular, a clock synthesis unit (CSU) 802 is a clock bus interface employed to remove noise from the signal coupled to the bidirectional driver 727 and subsequently coupled to the MGT pair 500 or an adjacent data transceivers. The CSU 802 is coupled to a 4:1 multiplexer 804, which receives a RXBMCLK signal from the MGT pair 500 by way of clock bus 806, a clock signal from the clock bus 726 by way of a clock bus 808, a clock signal from the clock bus 727 by way of a clock bus 810, or a clock signal from one of the HCLK rows by way of reference clock bus 722. The RXBMCLK is a clock synchronized with data transferred by the MGT pair. The CSU outputs a cleaned up clock signal (Synclk) by way of a clock bus 812 to the bi-directional clock driver 722. The Synclk clock signal could be routed to the MGT pair, and adjacent MGT tile or an HCLK row as described above with respect to FIG. 7.

Turning now to FIG. 9, a flow chart shows a method of routing a clock signal between a plurality of data transceivers in an integrated circuit according to an embodiment of the present invention. The method of FIG. 9, as well as the methods of the following FIGS. 10-13, could be implemented using the circuits described above. A plurality of data transceivers are provided in a column at a step 902. The column of data transceivers is positioned on an end of an integrated circuit at a step 904. A bus is positioned in the region occupied by the plurality of data transceivers at a step 906. A clock signal is coupled to the bus at a step 908. The clock signal could be coupled from the fabric of an FPGA circuit, a data transceiver, or from an external source. The clock signal is then routed between the data transceivers by way of the bus at a step 910. Depending upon the source of the clock signal, the clock could be routed between the plurality of data transceivers by the clock buses 726 or 727, or clock bus 753 of FIGS. 7 and 8, for example. The clock signal is also optionally routed to a clock interface coupled to internal circuits of the integrated circuits at a step 912.

Turning now to FIG. 10, a flow chart shows a method of routing a clock signal from a programmable logic circuit between a plurality of data transceivers in an integrated circuit according to an embodiment of the present invention. A plurality of data transceivers is provided in a column at a step 1002. The column is positioned on an end of the integrated circuit at a step 1004. A bus is provided in the region occupied by the plurality of data transceivers at a step 1006. The clock signal is received from a programmable logic circuit at a step 1008. The clock signal is coupled to the bus at a step 1010. For example, the clock signal could be routed from an HCLK row to reference clock bus 720 of FIGS. 7 and 8, for example. The clock signal could then be routed to the clock buses 726 or 727 by the bi-directional clock driver 722, for example. The clock signal is coupled to an adjacent data transceiver by way of the bus at a step 1012.

Turning now to FIG. 11, a flow chart shows a method of routing an external clock signal to a plurality of data transceivers and a programmable logic circuit of an integrated circuit according to an embodiment of the present invention. A plurality of data transceivers is provided in a column at a step 1102. The column is positioned on an end of the integrated circuit at a step 1104. A bus is provided between the plurality of data transceivers at a step 1106. An external clock signal is coupled from an external source to the bus at a step 1108. The external clock signal is routed to adjacent transceivers at a step 1110. The external clock is also routed to a data transceiver at a step 1112. Finally, the external clock is routed to internal circuits by way of HCLK rows associated with the MGT pair at a step 1114.

Turning now to FIG. 12, a flow chart shows a method of routing a clock signal generated by a data transceiver to a plurality of other data transceivers and a programmable logic circuit of an integrated circuit according to an embodiment of the present invention. A plurality of data transceivers is provided in a column at a step 1202. The column is positioned on an end of the integrated circuit at a step 1204. A bus is provided between the plurality of data transceivers at a step 1206. A clock signal is coupled from a data transceiver to the bus at a step 1208. The clock signal from the data transceiver is routed to adjacent transceivers, for example by the bi-directional clock driver 752, at a step 1210. The MGT clock signal is also coupled to an internal circuit, for example, by way of the bi-directional clock driver 752, at a step 1212.

Figure 13:
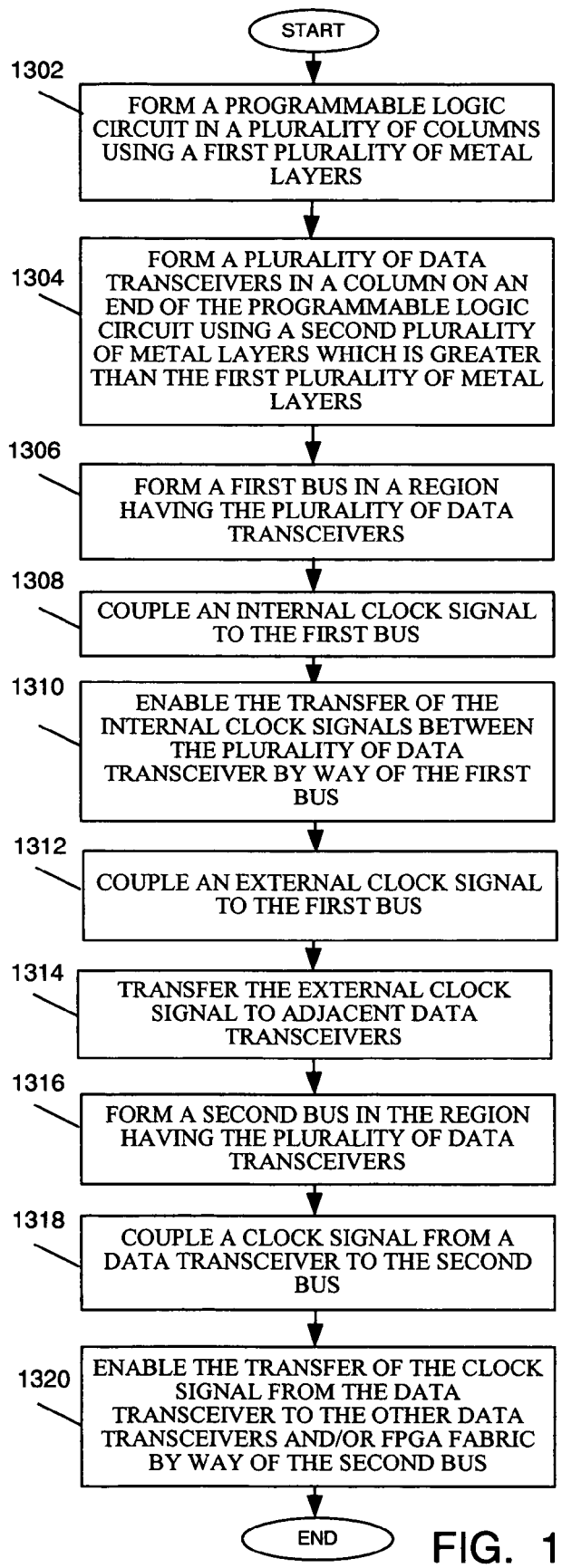
FIG. 13 is a flow chart showing a method of forming an integrated circuit according to an embodiment of the present invention.

Turning now to FIG. 13, a flow chart shows a method of forming an integrated circuit according to an embodiment of the present invention. A programmable logic circuit is formed in a plurality of columns using a first plurality of metal layers at a step 1302. A plurality of data transceivers is formed in a column on an end of the programmable logic circuit using a second plurality of metal layers which is greater than the first plurality of metal layers at a step 1304. A first bus is formed in a region having the plurality of data transceivers at a step 1306. An internal clock signal is coupled to the first bus at a step 1308. The transfer of the various clock signals between the plurality of data transceiver is enabled by way of the first bus at a step 1310. An external clock signal is coupled from an external source at a step 1312. The transfer of the external clock signal to adjacent data transceivers is enabled by way of the first bus at a step 1314. A second bus is formed in the region having the plurality of logic circuits at a step 1316. A signal from the data transceiver is coupled to a second bus at a step 1318. The transfer of the clock signal to the other data transceivers and/or internal circuits of the integrated circuits is enabled by way of the second bus at a step 1320. Although the methods of FIGS. 9-13 are described separately, it should be understood that the various methods could be performed simultaneously.

It can therefore be appreciated that the new and novel integrated circuit and method of routing a clock signal in an integrated circuit has been described. It will be appreciated by those skilled in the art that, particular the teaching herein, numerous alternatives and equivalents will be seen to exist which incorporate the disclosed invention. As a result, the invention is not to be limited by the foregoing embodiments, but only by the following claims.

The invention claimed is:

1. A clock routing circuit having a plurality of data transceivers, said clock routing circuit comprising:
   a clock bus interface enabling a selection of a clock signal of a plurality of clock signals;
   a first data transceiver coupled to said clock bus interface to receive said clock signal from said clock bus interface;
   a clock bus coupled to receive said clock signal, said clock bus enabling transfer of said clock signal to an adjacent data transceiver; and
   a routing circuit coupled to said clock bus for routing said clock signal to an adjacent data transceiver by way of said clock bus.

2. The clock routing circuit of claim 1 wherein said routing circuit comprises a first clock driver associated with said first data transceiver and coupled to said clock bus, said first clock driver coupled to receive an external clock.

3. The clock routing circuit of claim 2 wherein said first clock driver comprises a bi-directional clock driver coupling said external clock to an adjacent data transceiver by way of said clock bus.

4. The clock routing circuit of claim 3 further comprising a second clock driver coupled to said first data transceiver, said second clock driver coupling a clock signal generated by said first data transceiver to a second clock bus.

5. The clock routing circuit of claim 4 wherein said second clock bus is coupled to internal circuits of an integrated circuit having said clock routing circuit.

6. A clock routing circuit having a plurality of data transceivers, said clock routing circuit comprising:
   a clock driver associated with a data transceiver and coupled to receive an external clock;
   a first clock bus coupled to said clock driver, said first clock bus being controlled by said clock driver to couple said external clock to an adjacent data transceiver; and
   a data transceiver clock interface associated with said data transceiver and coupled to receive said external clock signal by way of said first clock bus,
   wherein said data transceiver clock interface enables a selection of a clock signal of a plurality of clock signals to be routed to said data transceiver.

7. The clock routing circuit of claim 6 further comprising a second clock driver coupled to said data transceiver.

8. The clock routing circuit of claim 7 further comprising a second clock bus coupled to said second clock driver and extending between said plurality of data transceivers.

9. The clock routing circuit of claim 8 wherein said second clock bus is coupled to internal circuits of an integrated circuit by way of an internal circuit clock interface.

10. A clock routing circuit in an integrated circuit having a plurality of data transceivers, each said data transceiver comprising:
    a data transceiver clock interface;
    a first clock bus extending between said plurality of data transceivers and coupled to a clock driver, said first clock bus receiving a first clock signal generated by said data transceiver by way of said clock driver; and
    an internal circuit clock interface receiving said first clock signal generated by said data transceiver and coupling said first clock signal to an internal circuit of said integrated circuit,
    wherein said internal circuit clock interface couples said first clock signal generated by said data transceiver to a second clock bus of said integrated circuit.

11. The clock routing circuit of claim 10 wherein said clock driver comprises a bi-directional clock driver for coupling said first clock signal to an adjacent data transceiver of said plurality of data transceivers.

12. The clock routing circuit of claim 10 further comprising a clock synthesis unit coupled to receive an external clock and generate a second clock signal.

13. The clock routing circuit of claim 12 wherein said clock synthesis unit is coupled to a third clock bus which receives said second clock signal.

14. The clock routing circuit of claim 13 wherein said internal circuit clock interface is coupled to said third clock bus, said internal circuit clock interface coupling said second clock signal to a programmable logic circuit.

15. An integrated circuit having a plurality of data transceivers, said integrated circuit comprising:
    a plurality of data transceivers positioned on an end of said integrated circuit;
    a first clock bus extending along said plurality of data transceivers; and
    a plurality of bi-directional clock drivers associated with said first clock bus, each bi-directional clock driver being associated with a data transceiver for transmitting clock signals to an adjacent data transceiver,
    wherein said clock signals comprise at least one of an external clock signal, a clock signal received from another data transceiver, or a clock signal from within said integrated circuit.

16. The integrated circuit of claim 15 further comprising a programmable logic circuit portion coupled to said plurality of bi-directional drivers, said programmable logic circuit being formed using a first plurality of metal layers.

17. The integrated circuit of claim 16 further comprising a second clock bus extending between said plurality of data transceivers, said second clock bus coupled to an internal circuit clock interface.

18. The integrated circuit of claim 17 wherein conductors for said data transceivers, said first clock bus, and said second clock bus are formed using a second plurality of metal layers which is greater than said first plurality of metal layers.

19. The integrated circuit of claim 15 further comprising a second plurality of data transceivers on a second end.

20. A method of routing a clock signal in an integrated circuit, said method comprising the steps of:
    providing a plurality of data transceivers in a column;
    providing a first clock bus coupling said plurality of data transceivers;
    selecting a first clock signal of a plurality of clock signals to be routed on said first clock bus; and
    routing said first clock signal to said plurality data transceivers by way of said first clock bus.

21. The method of claim 20 wherein said step of providing a plurality of data transceivers in a column comprises a step of providing a plurality of data transceivers in a column on an end of said integrated circuit.

22. The method of claim 20 further comprising a step of transferring said first clock signal to a data transceiver clock interface.

23. The method of claim 20 further comprising a step of providing a second bus extending between said plurality of data transceivers.

24. The method of claim 23 further comprising a step of coupling a second clock signal from said second bus to an internal circuit of said integrated circuit.

25. A method of routing a clock signal in an integrated circuit, said method comprising the steps of:
  providing a plurality of data transceivers on an end of said integrated circuit;
  providing a first clock bus between said plurality of data transceivers, said first clock bus being coupled to receive one of a plurality of clock signals;
  coupling a first clock signal of said plurality of clock signals to said first clock bus; and
  coupling said first clock signal from said first clock bus to an internal circuit of said integrated circuit.

26. The method of claim 25 further comprising a step of coupling said first clock signal to an adjacent data transceiver.

27. The method of claim 25 further comprising a step of providing a second clock bus between said plurality of data transceivers.

28. The method of claim 27 further comprising a step of coupling a second clock signal from said internal circuit to said second clock bus.

29. The method of claim 28 further comprising a step of coupling said second clock signal from said second clock bus to a data transceiver of said plurality of data transceivers.

30. A method of routing a clock signal in an integrated circuit, said method comprising the steps of:
  providing a plurality of data transceivers on an end of said integrated circuit;
  providing a first clock bus between said plurality of data transceivers;
  selecting a clock signal of a plurality of clock signals from an internal circuit of said integrated circuit; and
  coupling said clock signal from said internal circuit of said integrated circuit to said first clock bus.

31. The method of claim 30 further comprising a step of providing a second clock bus between said plurality of data transceivers.

32. The method of claim 31 further comprising a step of receiving an external clock.

33. The method of claim 32 further comprising a step of coupling said external clock to said internal circuit of said integrated circuit.

34. The method of claim 32 further comprising a step of coupling said external clock signal to said plurality of data transceivers.

35. A method of routing a clock signal in an integrated circuit, said method comprising the steps of:
  forming a programmable logic circuit using conductors in a first plurality of metal layers;
  forming a plurality of data transceivers in a column on an end of said programmable logic circuit using a second plurality of metal layers;
  forming a first clock bus in a region having said plurality of data transceivers in a metal layer of said second plurality of metal layers, wherein said second plurality of metal layers having conductors for said plurality of data transceivers and said first clock bus is greater than said first plurality of metal layers;
  enabling a selection of a first clock signal of a plurality of clock signals; and
  enabling the transfer of said first clock signal between said plurality of data transceivers.

36. The method of claim 35 wherein said step of forming a programmable logic circuit comprises forming a plurality of columns of circuits implementing programmable logic blocks.

37. The method of claim 35 further comprising a step of forming a second clock bus in said region having said plurality of data transceivers.

38. The method of claim 37 wherein said step of forming said second clock bus comprising a step of enabling the transfer of a second clock signal from said data transceivers to said programmable logic circuit.

39. The method of claim 38 further comprising a step of forming a second plurality of data transceivers on a second end of said integrated circuits.

* * * * *